United States Patent
Son et al.

(10) Patent No.: US 9,123,428 B2
(45) Date of Patent: Sep. 1, 2015

(54) E-FUSE ARRAY CIRCUIT

(71) Applicant: SK hynix Inc., Gyeonggi-do (KR)

(72) Inventors: Sungju Son, San Jose, CA (US);
Youncheul Kim, San Jose, CA (US);
Sungho Kim, Gyeonggi-do (KR);
Dongue Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/318,021

(22) Filed: Jun. 27, 2014

(65) Prior Publication Data

US 2014/0313842 A1  Oct. 23, 2014

Related U.S. Application Data

(62) Division of application No. 13/610,802, filed on Sep. 11, 2012, now Pat. No. 8,767,434.

(51) Int. Cl.

| | |
|---|---|
| *G11C 5/02* | (2006.01) |
| *G11C 5/06* | (2006.01) |
| *G11C 17/18* | (2006.01) |
| *H01L 23/525* | (2006.01) |
| *G11C 17/16* | (2006.01) |
| *G11C 17/00* | (2006.01) |
| *G11C 29/02* | (2006.01) |
| *G11C 29/00* | (2006.01) |

(52) U.S. Cl.
CPC .............. *G11C 17/18* (2013.01); *G11C 17/16* (2013.01); *H01L 23/5256* (2013.01); *G11C 17/00* (2013.01); *G11C 17/165* (2013.01); *G11C 29/027* (2013.01); *G11C 29/787* (2013.01); *G11C 2229/763* (2013.01)

(58) Field of Classification Search
CPC . G11C 17/16; G11C 17/165; G11C 2229/763
USPC ............ 365/94, 96, 225.7; 257/529, E23.149
See application file for complete search history.

(56) References Cited

U.S. PATENT DOCUMENTS

| | | | |
|---|---|---|---|
| 5,241,496 A * | 8/1993 | Lowrey et al. ................... | 365/96 |
| 7,436,028 B2 * | 10/2008 | Yang et al. ..................... | 257/368 |
| 2012/0241826 A1 * | 9/2012 | Satoh et al. .................... | 257/295 |

* cited by examiner

*Primary Examiner* — Ly D Pham
(74) *Attorney, Agent, or Firm* — IP & T Group LLP

(57) ABSTRACT

An e-fuse array circuit includes: an e-fuse transistor of a vertical gate type configured to have a gate for receiving a voltage of a program gate line and have one between a drain terminal and a source terminal floating; and a selection transistor of a buried gate type configured to have a gate for receiving a voltage of a word line gate line and electrically connect/disconnect the other one between the drain terminal and the source terminal with a bit line.

2 Claims, 5 Drawing Sheets

E-FUSE ARRAY CIRCUIT

This application is a division of U.S. patent application Ser. No. 13/610,802 filed on Sep. 11, 2012. The disclosure of each of the foregoing applications is incorporated herein by reference in its entirety.

BACKGROUND

1. Field

Exemplary embodiments of the present invention relate to an e-fuse array circuit, and more particularly, to a structure of an e-fuse array circuit.

2. Description of the Related Art

A general fuse recognizes a data based on whether a fuse is cut or not by a laser. Therefore, a fuse may be programmed in the stage of wafer, but the fuse cannot be programmed once the wafer is mounted in the inside of a package.

To overcome this concern, an e-fuse is used. An e-fuse stores a data by using a transistor and changing the resistance between a gate and a drain/source.

FIG. 1 is schematic diagram illustrating an e-fuse formed of a transistor, the e-fuse operating as a resistor or a capacitor.

Referring to FIG. 1, the e-fuse is formed of a transistor T, and a power source voltage is applied to a gate G while a ground voltage is applied to a drain/source D/S.

When a general power source voltage that the transistor T may tolerate is applied to the gate G, the e-fuse operates as a capacitor C. Therefore, no current flows between the gate G and the drain/source D/S. When a high power source voltage that the transistor T may not tolerate is applied to the gate G, a gate oxide of the transistor T is destroyed to short the coupling between the gate G and the drain/source D/S and the e-fuse operates as a resistor R. Therefore, current flows between the gate G and the drain/source D/S. By taking advantage of these results, data of the e-fuse may be recognized from the resistance value between the gate G and the drain/source D/S of the e-fuse. The data of the e-fuse may be recognized by 1) enlarging the size of the transistor T without additionally performing a sensing operation, or by 2) using an amplifier and sensing the current flowing through the transistor T instead of increasing the size of the transistor T. The two methods, however, have a concern regarding dimensional restriction because the size of the transistor T has to be designed large or an amplifier for amplifying a data has to be added to each e-fuse.

U.S. Pat. No. 7,269,047 discloses a method for decreasing the space occupied by an e-fuse by forming an e-fuse array.

FIG. 2 is a circuit diagram of a conventional cell array 200 including e-fuses.

Referring to FIG. 2, the cell array 200 includes memory cells 201 to 216 that are arrayed in N rows and M columns. The memory cells 201 to 216 include memories M1 to M16 and switches S1 to S16, respectively. The memories M1 to M16 are e-fuses having characteristics of either a resistor or a capacitor based on whether rupturing has occurred or not. In other words, the e-fuses M1 to M16 may be regarded as resistive memories for storing data according to the value of resistance. The switches S1 to S16 electrically connect the memories M1 to M16 with the switches S1 to S16 under the control of word line gate lines WLR1 to WLRN.

Hereafter, it is assumed that a second row is a selected row and an $M^{th}$ column is a selected column. In other words, it is assumed that a memory cell 208 is a selected memory cell. Voltages applied to the selected memory cell 208 and unselected memory cells 201 to 207 and 209 to 216 during a program/read operation are described below.

Program Operation

A word line gate line WLR2 of the selected row is enabled and the other word line gate lines WLR1 and WLR3 to WLRN are disabled. As a result, switches S5 to S8 are turned on, and the switches S1 to S4 and S9 to S16 are turned off. A high voltage level that could destroy a gate oxide of an e-fuse (which is generally a high voltage generated by supplying a power source voltage) is applied to the program gate line WLP2 of the selected row, and a low-level voltage such as a ground voltage is applied to the other program gate lines WLP1 and WLP3 to WLPN. The selected bit line BLM is coupled with a data access circuit, and the unselected bit lines BL1 to BLM-1 float. The data access circuit drives the selected bit line BLM with a low-level voltage, and programs or ruptures a memory M8 of the selected memory cell 208, when an inputted data is a program data, e.g., '1'. When an inputted data is not a program data, for example, when the inputted data is '0', the data access circuit drives the selected bit line BLM with a high-level voltage and does not program the memory M8 of the selected memory cell 208. Because the unselected bit lines BL1 to BLM-1 float, the memories M5 to M7 are not programmed even with a high voltage that is supplied to a gate.

Read Operation

The word line gate line WLR2 of the selected row is enabled, and the other word line gate lines WLR1 and WLR3 to WLRN are disabled. As a result, switches S5 to S8 are turned on, and the switches S1 to S4 and S9 to S16 are turned off. An appropriate level of voltage for a read operation, which is generally a power source voltage, is supplied to a program gate line WLP2 of the selected row, and a low-level voltage such as a ground voltage is supplied to the other program gate lines WLP1 and WLP3 to WLPN. The selected bit line BLM is coupled with a data access circuit, and the unselected bit lines BL1 to BLM-1 float. The data access circuit (not shown) recognizes that the memory M8 is programmed, when current flows through the selected bit line BLM. In other words, the data access circuit recognizes that the data of the selected memory cell 208 is '1'. When no current flows through the selected bit line BLM, the data access circuit recognizes that the memory M8 is not programmed. In short, the data access circuit recognizes the data of the selected memory cell 208 as '0'.

Herein, one bit line BLM is selected among the multiple bit lines BL1 to BLM for the purpose of illustration, but a plurality of bit lines may be selected at one time. In short, a plurality of memory cells belonging to one row may be programmed/read simultaneously.

SUMMARY

Exemplary embodiments of the present invention are directed to an optimal cell array structure for an e-fuse array circuit.

In accordance with an exemplary embodiment of the present invention, an e-fuse array circuit includes: an e-fuse transistor of a vertical gate type configured to have a gate for receiving a voltage of a program gate line and have one between a drain terminal and a source terminal floating; and a selection transistor of a buried gate type configured to have a gate for receiving a voltage of a word line gate line and electrically connect/disconnect the other one between the drain terminal and the source terminal with a bit line.

In accordance with another exemplary embodiment of the present invention, an e-fuse array circuit includes a first gate insulation layer formed over a substrate, a program gate formed over the first gate insulation layer, a second gate insulation layer formed on an internal surface of a trench that is formed by etching the substrate, and a word line gate filling the trench where the second gate insulation layer is formed.

DETAILED DESCRIPTION

Figure 1:
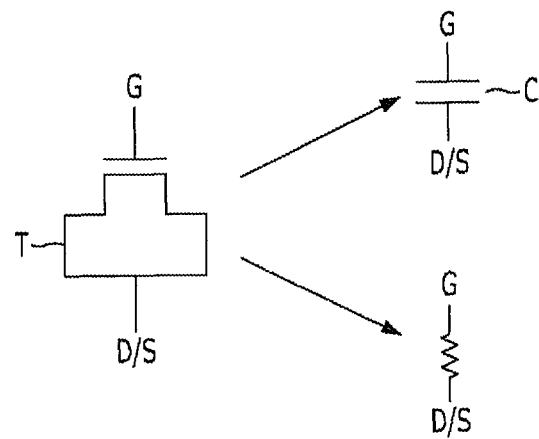
FIG. 1 is schematic diagram illustrating an e-fuse formed of a transistor, the e-fuse operating as a resistor or a capacitor.
Figure 2:
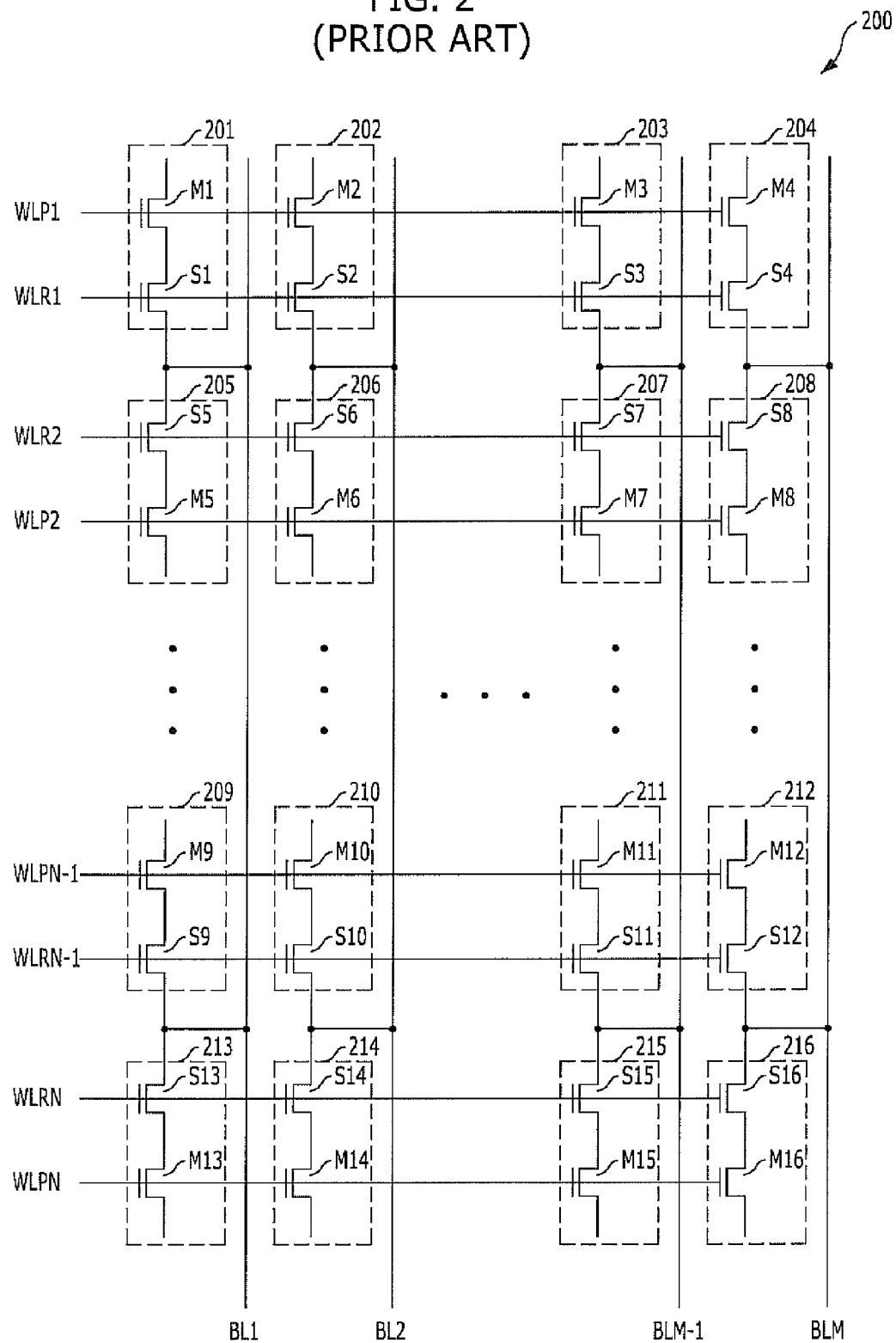
FIG. 2 is a circuit diagram of a conventional cell array 200 including e-fuses.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
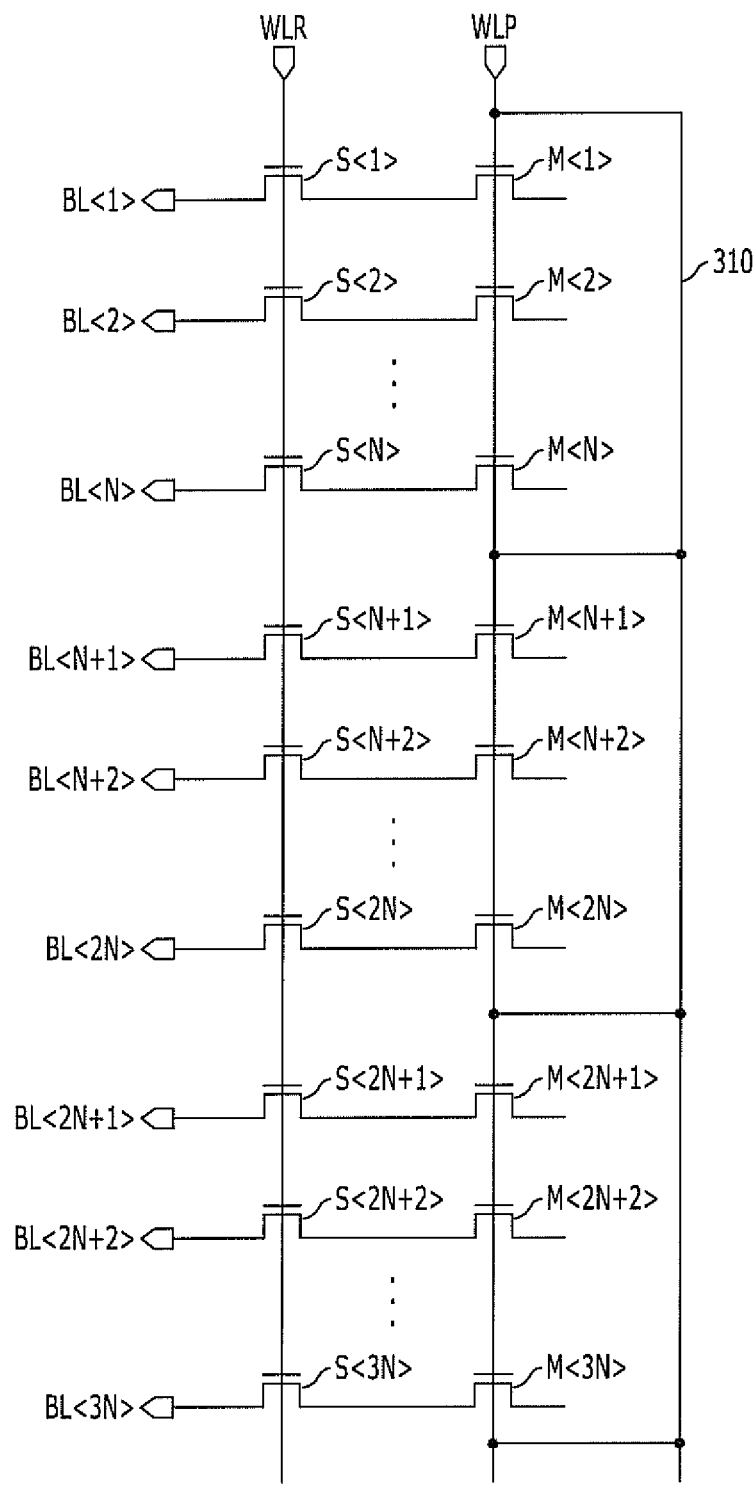
FIG. 3 is a block view illustrating an e-fuse array circuit in accordance with an embodiment of the present invention.

FIG. 3 is a block view illustrating an e-fuse array circuit in accordance with an embodiment of the present invention.

Referring to FIG. 3, the e-fuse array circuit includes a plurality of e-fuse transistors M<1> to M<3N>, a plurality of selection transistors S<1> to S<3N>, a program gate line WLR, a word line gate line WLR, and a metal line 310.

The e-fuse transistors M<1> to M<3N> operate as memories, and they store a data of '1' or '0' based on whether gate oxide is destroyed or not. The gates of the e-fuse transistors M<1> to M<3N> may be controlled by the program gate line WLP.

The selection transistors S<1> to S<3N> are serially coupled with the e-fuse transistors M<1> to M<3N>, respectively. When the selection transistors S<1> to S<3N> are turned on, the selection transistors S<1> to S<3N> electrically connect the e-fuse transistors M<1> to M<3N> with bit lines BL<1> to BL<3N>. The gates of the selection transistors S<1> to S<3N> may be controlled by the word line gate line WLR.

The metal line 310 is a line for metal-strapping the program gate line WLP. The metal line 310 may be electrically connected with the program gate line WLP at a plurality of nodes, and a predetermined number N of e-fuse transistors may be disposed between the nodes.

When the e-fuse array circuit performs a program operation, a high voltage that could destroy the gate oxide of the e-fuse transistors M<1> to M<3N> is supplied to the program gate line WLP. In other words, a great deal of current is supplied to the program gate line WLP. Since the metal line 310 metal-straps the program gate line WLP, the high voltage may be efficiently supplied to the program gate line WLP. Meanwhile, because the word line gate line WLR requires a voltage level that may turn on/off the selection transistors S<1> to S<3N>, the metal-strapping of the word line gate line WLR may not be necessary.

The e-fuse array circuit according to the embodiment of the present invention operates similarly as the conventional e-fuse array circuit. Because the operation of conventional e-fuse array circuit is already described in the Description of the Related Art, further description on that matter is not provided herein.

Figure 4:
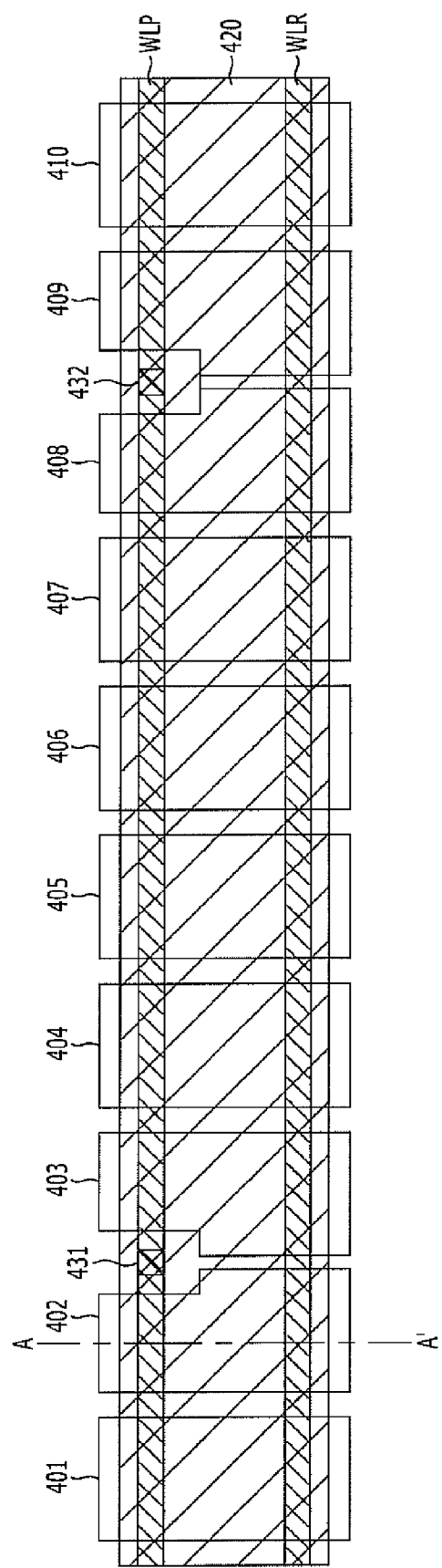
FIG. 4 is an illustration of a layout of FIG. 3.

FIG. 4 is an illustration of a layout of FIG. 3.

FIG. 4 shows an exemplary layout of 10 e-fuse transistors corresponding to 10 selection transistors among the multiple e-fuse transistors and the multiple selection transistors.

Referring to FIG. 4, the e-fuse transistors and the selection transistors are formed in active regions 401 to 410, respectively. The gates of the e-fuse transistors are coupled with the program gate line WLP that may be formed of polysilicon, whereas the gates of the selection transistors are coupled with the word line gate line WLR that may be formed of polysilicon.

A metal line 420 is formed to overlap with the regions of the program gate line WLP and the word line gate line WLR. Based on another embodiment of the present invention, the metal line 420 may be formed to cover the upper portions of the program gate line WLP and the word line gate line WLR. The metal line 420 is electrically connected with the program gate line WLP through contact plugs 431 and 432.

The contact plugs 431 and 432 may electrically connect the metal line 420 with the program gate line WLP in the regions other than active regions 401 to 410. The contact plugs 431 and 432 may also be formed to electrically connect the metal line 420 with the program gate line WLP in the active regions 401 to 410. Meanwhile, portions of the e-fuse transistors in the active regions 402, 403, 408 and 409 that are adjacent to the contact plugs 431 and 432 may be formed narrower than the e-fuse transistors in the active regions 401, 404 to 407, and 410. Herein, the e-fuse transistors in the active regions 402, 403, 408 and 409 that are adjacent to the contact plugs 431 and 432 may be dummy active regions, which are not actually used. An irregular pattern may be formed in the portion where contacts are formed by the contact plugs 431 and 432. The dummy active regions 402, 403, 408 and 409 exist to prevent the irregular pattern from being formed.

Figure 5:
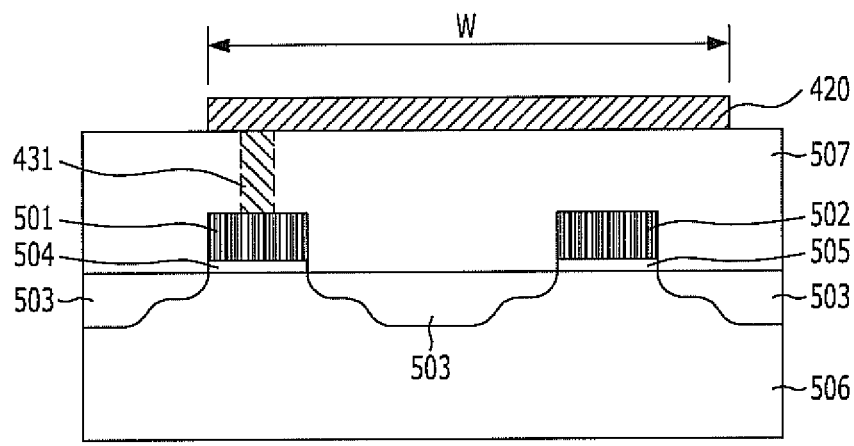
FIG. 5 is a cross-sectional view of an A-A' cross-section shown in FIG. 4.

FIG. 5 is a cross-sectional view of an A-A' cross-section shown in FIG. 4.

Referring to FIG. 5, the metal line 420 is formed to have a width W that is sufficiently wide to cover the program gates 501 of the e-fuse transistors and the word line gates 502 of the selection transistors. The contact plug 431 may electrically connect the program gates 501 of the e-fuse transistors, which are the program gate line WLP, with the metal line 420. For example, the contact plug 431 may be directly coupled with the program gates 501 of the e-fuse transistors, or the contact plug 431 may be directly coupled with the program gate line WLP that couples the program gates 501 of the e-fuse transistors. Although the drawing illustrates that the contact plug 431 and the program gates 501 of the e-fuse transistors may be disposed on the same cross-section for the sake of convenience in description, they may be disposed on different cross-sections, as illustrated in FIG. 4.

In FIG. 5, a reference numeral '503' denotes a drain/source region, and reference numerals '504' and '505' denote gate oxide. A reference numeral '506' denotes a substrate, and a reference numeral '507' denotes an inter-layer dielectric layer between the gates 501 and 502 and the metal line 420.

Referring to FIG. 5, metal-strapping by using the metal line 420 may occur only in the e-fuse program gate line, and the metal line may be formed to have a sufficiently wide width W. Therefore, a high voltage may be efficiently supplied through the e-fuse program gate line WLP.

Figure 6:
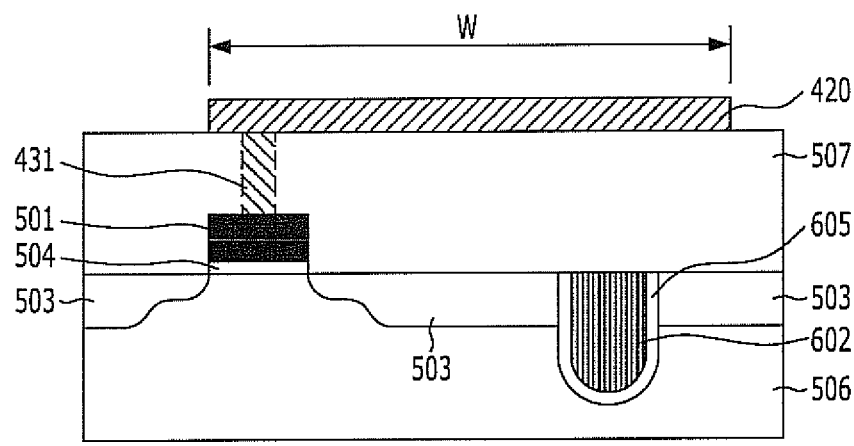
FIG. 6 is a cross-sectional view of an e-fuse array circuit in accordance with another embodiment of the present invention.

FIG. 6 is a cross-sectional view of an e-fuse array circuit in accordance with another embodiment of the present invention.

Referring to FIG. 6, e-fuse transistors are formed in the same vertical gate type as those of FIG. 5, but selection transistors are formed in a buried gate type that is different from the type of the selection transistors shown in FIG. 5.

The selection transistors that are formed in the buried gate type include a gate insulation layer 605 that is formed along the internal surface of trenches formed by etching a substrate 506, and a word line gate 602 that fills the trenches where the gate insulation layer 605 is formed. A drain/source region 503 is formed on both sides of the word line gate 602. The trenches for forming the gate insulation layer 605 and the word line gates 602 may be formed deeper than the drain/source region 503 as illustrated in the drawing.

The buried gate type of transistors may have sufficiently long channel length while occupying a narrower space than a vertical gate type of transistors. Therefore, if the selection transistors are formed in the buried gate type, then the desirable switching characteristics of selection transistors may be obtained while reducing the space occupied by the selection transistors.

Also, because the e-fuse transistors may be formed in the vertical gate type, the data storing function may be performed based on whether the gate oxide 504 is destroyed or not.

According to the exemplary embodiment of the present invention, the program gate line may be selectively metal-strapped between the program gate lines and word line gate lines of an e-fuse array circuit. Also, because the area of a metal line for metal-strapping may be increased by using the upper portions of the word line gate lines that are not metal-strapped, a sufficient amount of current may be supplied to the program gate lines.

Also, according to an embodiment of the present invention, an e-fuse transistor may be formed in a vertical gate type, and a selection transistor may be formed in a buried gate type. Therefore, the e-fuse transistor is appropriate for storing data based on whether its gate oxide is destroyed or not, and the selection transistor may operate as a switch of a desirable form based on the preferable extended channel length.

While the present invention has been described with respect to the specific embodiments, it will be apparent to those skilled in the art that various changes and modifications may be made without departing from the spirit and scope of the invention as defined in the following claims.

What is claimed is:

1. An e-fuse array circuit, comprising:
   an e-fuse transistor of a vertical gate type configured to have a gate for receiving a voltage of a program gate line and have one between a drain terminal and a source terminal floating; and
   a selection transistor of a buried gate type configured to have a gate for receiving a voltage of a word line gate line and electrically connect/disconnect the other one between the drain terminal and the source terminal with a bit line,
   wherein, the program gate line is metal-strapped by a metal line.

2. The e-fuse array circuit of claim 1, comprising:
   a plurality of e-fuse memory cells each including the e-fuse transistor and the selection transistor.

* * * * *